US008329382B2

(12) United States Patent
Jarek et al.

(10) Patent No.: US 8,329,382 B2
(45) Date of Patent: Dec. 11, 2012

(54) METHOD OF PROCESSING ELEMENTS WITH COALESCED PARTICLES

(75) Inventors: Mathias Jarek, Northeim (DE); Domenico Balbinot, Osterode am Harz (DE)

(73) Assignee: Eastman Kodak Company, Rochester, NY (US)

( * ) Notice: Subject to any disclaimer, the term of this patent is extended or adjusted under 35 U.S.C. 154(b) by 562 days.

(21) Appl. No.: 12/552,362

(22) Filed: Sep. 2, 2009

(65) Prior Publication Data

US 2011/0053089 A1 Mar. 3, 2011

(51) Int. Cl.
*G03F 7/00* (2006.01)
*G03F 7/26* (2006.01)
*B41F 7/00* (2006.01)

(52) U.S. Cl. .................. 430/302; 430/270.1; 430/281.1; 430/401; 101/450.1

(58) Field of Classification Search ............... 430/270.1, 430/302, 454; 101/450.1, 453, 463.1
See application file for complete search history.

(56) References Cited

U.S. PATENT DOCUMENTS

| | | | | |
|---|---|---|---|---|
| 5,609,980 | A | 3/1997 | Matthews et al. | |
| 6,030,750 | A | 2/2000 | Vermeersch et al. | |
| 6,054,245 | A * | 4/2000 | Azuma et al. | 430/137.17 |
| 6,110,644 | A | 8/2000 | Vermeersch et al. | |
| 6,218,073 | B1 | 4/2001 | Shimizu et al. | |
| 6,427,595 | B1 * | 8/2002 | Van Damme et al. | 101/457 |
| 6,692,890 | B2 * | 2/2004 | Huang et al. | 430/270.1 |
| 2004/0202955 | A1 * | 10/2004 | Goodin | 430/269 |
| 2007/0009824 | A1 * | 1/2007 | Kidokoro | 430/108.4 |

FOREIGN PATENT DOCUMENTS

| | | |
|---|---|---|
| EP | 0 514 145 | 11/1992 |

OTHER PUBLICATIONS

U.S. Appl. No. 12/017,366, filed Jan. 22, 2008, titled Imageable Elements With Coalescing Core-Shell Particles, by J. Mathias.
U.S. Appl. No. 12/412,400, filed Mar. 27, 2009, titled Negative-Working Thermal Imageable Elements, by J. Mathias et al.
U.S. Appl. No. 12/477,226, filed Jun. 3, 2009, titled On-Press Development of Imaged Elements, by D. Balbinot et al.

* cited by examiner

*Primary Examiner* — Amanda C. Walke
*Assistant Examiner* — Chanceity Robinson
(74) *Attorney, Agent, or Firm* — J. Lanny Tucker

(57) ABSTRACT

Imageable elements can be imaged and then processed using a solution containing core-shell particles that are designed to complex with non-coalesced particles in the non-exposed regions of imaged element. A separate development step is not needed, but the non-coalesced particles and complexed core-shell particles can be removed from the resulting printing plate before using the resulting lithographic printing plate for printing.

18 Claims, No Drawings

METHOD OF PROCESSING ELEMENTS WITH COALESCED PARTICLES

FIELD OF THE INVENTION

This invention relates to a method of providing imaged elements such as lithographic printing plates from imageable elements having coalesceable polymeric particles in the imaging layer. After imaging, a processing solution containing water-swellable core-shell polymeric particles is applied to the imaged element. These core-shell particles form a non-covalent complex with the coalesced polymer particles in the non-exposed regions of the imaged element.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers that image in response to signals from a digital copy of the image in a computer a platesetter. This "computer-to-plate" technology has generally replaced the former technology where masking films were used to image the elements.

Thermal imaging has especially become important with digital imaging systems because of their stability to ambient light. The elements are designed to be sensitive to heat or infrared radiation and can be exposed using thermal heads or more usually, infrared laser diodes. Heat that is generated from this exposure can be used in a number of ways, for example, ablation to physical remove imaged areas, polymerization of photosensitive compositions, insolubilization by crosslinking polymers, rendering polymers alkaline solution soluble, decomposition, or coagulation of thermoplastic particles. Most of these imaging techniques require the use of alkaline developers to remove exposed (positive-working) or non-exposed (negative-working) regions of the imaged layer(s).

Thermally meltable or fusable particles having surface functional groups have been used in imageable elements as described for example, in U.S. Pat. No. 6,218,073 (Shimizu et al.), U.S. Pat. No. 6,509,133 (Watanabe et al.), and U.S. Pat. No. 6,627,380 (Saito et al.). Other meltable polymeric particles are described in U.S. Pat. No. 6,692,890 (Huang et al.).

Coalesceable thermoplastic polymeric particles dispersed within hydrophilic binders in imageable elements are described, for example, in U.S. Pat. No. 6,030,750 (Vermeersch et al.) and U.S. Pat. No. 6,110,644 (Vermeersch et al.).

Core-shell particles are used in imageable layers according to U.S. Pat. No. 5,609,980 (Matthews et al.) and coalesce upon thermal imaging. The shell of the particles is soluble or swellable in aqueous media.

EP 514,145A1 (Matthews et al.) describes thermally-sensitive imageable elements containing heat-softenable core-shell particles in the imaging layer. Such particles coalesce upon heating and the non-coalesced particles are removed using an alkaline developer. The shells of these particles are specifically non-water soluble.

A similar composition is described in EP 1,642,714A1 (Wilkinson et al.) in which the core-shell particles are dispersed within a hydrophilic binder. Non-exposed particles are removed using a gum solution instead of an alkaline developer.

Processing of imaged elements with coalesced particles can be carried out in a single processing bath that may contain a "gum" or lower pH processing solution. However, as this single processing bath is used or "seasoned", it becomes contaminated with removed coating that is redeposited and dried onto the non-exposed regions on the printing surface, causing toning on the printing press. There is a need to solve this problem.

SUMMARY OF THE INVENTION

The present invention provides a method of providing an image comprising:

A) thermally imaging a negative-working imageable element that comprises a hydrophilic substrate and has thereon a thermally-sensitive imageable layer comprising an infrared radiation absorbing compound and polymeric particles that coalesce upon thermal exposure, to provide an imaged element with exposed regions and non-exposed regions, the exposed regions comprising coalesced polymeric particles, and B) contacting the imaged element with a processing solution having a pH greater than 7 to about 14 to remove the polymeric particles in the non-exposed regions, the processing solution comprising water-swellable core-shell polymeric particles that are different from the polymeric particles in the imageable layer.

The invention can be used to provide a lithographic printing plate having an aluminum-containing substrate comprising a hydrophilic surface.

The method of this invention can be used to reduce toning during printing when coalesced particles are used for imaging in a single imageable layer. The non-imaged (non-exposed) regions of the imageable layer are readily removed using a processing solution containing core-shell polymeric particles that form a non-covalent and non-ionic complex with the coalesced polymeric particles in the imaged element. The complexed particles are removed from the non-exposed regions and little or no toning is observed in the printed impressions.

DETAILED DESCRIPTION OF THE INVENTION

Definitions

Unless the context indicates otherwise, when used herein, the terms "imageable element", "negative-working imageable element", and "lithographic printing plate precursor" are meant to be references to embodiments used in the present invention.

In addition, unless the context indicates otherwise, the various components described herein such as "core-shell particles", "infrared radiation absorbing compound", "hydrophobic polymer", "hydrophilic polymer", and similar terms also refer to mixtures of such components. Thus, the use of the article "a" or "an" is not necessarily meant to refer to only a single component.

By "single-layer" imageable element, we mean an imageable element that has only a single layer needed for providing an image. Coalesceable particles (defined below) would be located in this single imageable layer that is usually the outermost layer. However, such elements may comprise additional non-imaging layers on either side of the substrate and underneath the imageable layer in the imageable elements used in this invention.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements described herein can be used in a number of ways such as precursors to lithographic printing plates as described in more detail below. However, this is not meant to be their only use. For example, the imageable elements can also be used as thermal patterning systems or to form masking elements and printed circuit boards.

Coalesceable Particles

The coalesceable polymeric particles present in the imageable layer are "thermoplastic" meaning that they generally have a glass transition temperature of at least 40° C. or typically of at least 50° C. and thus can be melted or coalesced during thermal imaging that provides heating at a suitable temperature above the glass transition temperature. Useful polymers of this type include but are not limited to, poly(vinyl chloride), poly(vinylidene chloride), poly(meth)acrylonitriles, poly(vinyl carbazole), polystyrenes (including polymers of styrene derivatives), poly(meth)acrylates, copolymers derived from two or more of vinyl chloride, vinylidene chloride, styrene and derivatives thereof, (meth)acrylates, vinyl carbazole, and mixtures of such polymers. The molecular weight of such polymers can range from about 5,000 to about 5,000,000 g/mol. Useful coalesceable polymeric particles and methods of making them are described for example in U.S. Pat. No. 6,427,595 (Van Damme et al.) and EP 1,642,714 (Wilkinson et al.).

Some of the coalesceable particles used in the imageable layer are homogeneous in composition, but in other embodiments, these particles are core-shell particles. The core-shell particles typically have a hydrophobic polymer core containing one or more hydrophobic polymers. The useful hydrophobic polymers are also "thermoplastic" as defined above. Useful hydrophobic thermoplastic polymers include, but are not limited to polystyrenes, poly(meth)acrylates, poly(methylenelactone), poly(meth)acrylonitrile, poly(vinyl chloride), polyvinyl esters, polysulfone, polycarbonate, polyurethane, and polyamides. Representative polymers in these classes include polystyrene, poly(methyl methacrylate), poly[methyl (meth)acrylate], polymethylenelactone, poly[(meth)acrylonitrile], and poly(vinyl chloride).

The core of the coalesceable particles generally has an average diameter of from about 20 to about 120 nm and typically from about 30 to about 100 nm, and the volume of the core polymer(s) comprises from about 75 to about 95% of the particle volume. The sizes can be determined using SEM.

The shell of the coalesceable particles is composed of one or more hydrophilic polymers that have reactive groups that can bond with the hydrophobic polymer(s) of the core. In some instances, the shell polymers are "hydrophilic" in the sense that they are more water-loving than the core polymer(s). Thus, the shell polymers can contain one or more different types of acidic groups, such as carboxy, sulfo, or phospho groups that have been partially or fully neutralized with a suitable base such as a hydroxide. For example, the shell polymers can contain carboxy groups wherein from about 5 to about 80 mol % of the carboxy groups have been neutralized with sodium hydroxide, potassium hydroxide, or ammonium hydroxide. The shell polymer(s) can have recurring units that are derived at least in part from one or more of (meth)acrylic acid, tetrazole(meth)acrylate, (poly)ethylene glycol(meth)acrylate phosphates, phosphate (meth)acrylates, cyclic urea methacrylate (Plex-O 6850) vinyl phosphonic acid, and sulfonated (meth)acrylates, in combination with one or more (meth)acrylamides.

In some embodiments, the shell comprises a polymer comprising recurring units derived from one or more of a (meth)acrylamide, vinyl imidazole, N-(meth)acryloyltetrazole, vinyl pyrrolidone, or mixtures thereof.

In other embodiments, the shell polymer has recurring units derived from one or more of (meth)acrylic acid, sulfonated (meth)acrylate, phosphate(meth)acrylate, vinyl phosphonic acid, or mixtures thereof and, and one or more (meth)acrylamides.

It is desirable that the one or more hydrophilic shell polymers be covalently bonded to the one or more hydrophobic core polymers through reactive (meth)acrylic acid groups in the hydrophobic core polymer(s).

The shell thickness is generally from about 1 to about 5 nm and it generally comprises from about 5 to about 25% of the volume of the core-shell particles, on average (some particles may be less than 5% and others more than 25%, but the average volume is within the noted range). The shell is believed to entirely cover the core of most or all particles, but there may be some particles in which the shell only partially covers the core.

The resulting core-shell particles generally have an average particle size of from about 25 to about 150 nm or from about 35 to about 110 nm, as measured for example, using a scanning electron microscope (SEM) and known procedures for its use.

The homogeneous coalesceable particles can be prepared using known polymerization procedures and starting materials that would be readily apparent to a polymer chemist, or in some instances, they can be obtained from various commercial sources. The coalesceable core-shell particles are generally prepared as dispersions as described for the Examples below. Generally, the core polymer is formed by emulsion or suspension polymerization using known reactants and conditions to provide an initial dispersion. After a suitable period of reaction, monomers and free radical initiators are added to the dispersion to form the shell polymer(s) around the individual polymer cores.

Some polymers used to form the shells may be highly water soluble, and so the resulting dispersions may also include free "shell" polymer suspended in the reaction medium, for example up to 5 weight % based on the imageable layer dry weight. In other embodiments, there is little or no free polymeric binder in the imageable layer, that is, generally less than 10 and typically less than 5 weight % of the imageable layer comprises hydrophilic polymeric binders. In such embodiments, the imageable layer consists essentially of the coalesceable polymeric particles and an infrared radiation absorbing compound.

Other coalesceable polymer dispersions may include hydrophilic polymers including but not limited to, poly(vinyl alcohol), poly(vinyl pyrrolidone), poly(ethylene oxide), poly(meth)acrylamide, poly(methylol(meth)acrylamide), poly(meth)acrylic acid, poly(hydroxylethyl(meth)acrylate), maleic anhydride/vinylmethyl ether copolymers, copolymers prepared from the various monomers used to make the listed homopolymers, gelatin, a polysaccharide, and other materials that would readily apparent to one skilled in the art.

The polymeric particle dispersions may be naturally stable and remain suspended, or surfactants can be added to stabilize the particles for a suitable time.

Imageable Elements

Generally, the imageable elements include the coalesceable polymeric particles described above in a single and outermost imageable layer.

In general, imageable elements are formed by suitable application of an imageable layer formulation containing the coalesceable polymeric particles to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support having a hydrophilic surface that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

The imageable element also includes one or more infrared radiation absorbing compounds that absorb radiation from about 600 to about 1400 nm and typically from about 700 to about 1250 nm. Such compounds include various IR-absorbing pigments and dyes.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds also include various pigments such as carbon blacks including carbon blacks that are surface-functionalized with solubilizing groups. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The infrared radiation absorbing compound is generally present in the imageable element in an amount of at least 1% and up to 30 weight % and typically from about 5 to about 30 weight % (based on total dry layer weight). In most embodiments, the infrared radiation absorbing compound is present only in the single imageable layer. Alternatively or additionally, infrared radiation absorbing compounds may be located in a separate layer that is in thermal contact with the single imageable layer. Thus, during imaging, the action of the infrared radiation absorbing compound can be transferred to the imageable layer without the compound originally being incorporated into it.

The imageable layer includes the coalesceable polymeric particles described above in a sufficient amount generally to provide at least 50 weight %, and typically from about 60 to about 95 weight %, and typically from about 5 to about 30 weight % of an infrared radiation absorbing compound, based on the total imageable layer dry weight.

An imageable layer comprising coalesceable polymeric particles (usually in an aqueous dispersion), and optionally one or infrared more radiation-sensitive compounds and any other additives (described below), can be prepared by dispersing the components in a suitable solvent medium (described below).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

If homogenous particles are used, a hydrophilic binder may be present. Useful hydrophilic binders include, but are not limited to, to those described above in relation to the coalesceable polymeric particle dispersions.

In some embodiments, the thermally-sensitive imageable layer is soluble or dispersible in water.

The imageable element can be prepared by applying the imageable layer formulation over the surface of the substrate (and any other hydrophilic layers provided thereon) using conventional coating or lamination methods. Thus, the formulations can be applied by dispersing or dissolving the desired ingredients in a suitable coating solvent and hydrophilic binder (if desired), and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the imageable layer can be from about 0.4 to about 3 $g/m^2$ and typically from about 0.5 to about 2 $g/m^2$.

The selection of solvents used to coat the imageable layer formulation depends upon the nature of the coalesceable polymeric materials and other components in the formulations. Generally, the imageable layer formulation is coated out of acetone, methanol, or an aqueous solution containing methanol, ethanol, isopropyl alcohol, n-propanol, n-butanol, and mixtures thereof using conditions and techniques well known in the art.

Intermediate drying steps may be used between applications of the various layer formulations to remove solvent(s) before coating other formulations. Drying steps may also help in preventing the mixing of the various layers.

Imaging and Development

The single-layer imageable elements can have any useful form including, but not limited to, printing plate precursors, printing cylinders, printing sleeves (solid or hollow cores) known as rotary printing members, and printing tapes (including flexible printing webs). For example, the imageable elements can be printing plate precursors useful for providing lithographic printing plates having hydrophilic substrates.

During use, the imageable elements are exposed to a suitable source of thermal energy such as infrared radiation, depending upon the radiation absorbing compound present in the element, for example at a wavelength of from about 600 to about 1400 nm. In some embodiments, imaging can be carried out using an infrared laser at a wavelength of from about 700 to about 1400 nm and typically from about 700 to about 1250 nm. The lasers used to expose the imageable elements are usually diode lasers (for example an array of diode lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds (exposure) may be in the range of from about 100 to about 1500 mJ/$cm^2$, and typically from about 100 to about 400 mJ/$cm^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Polymeric particles coalesced from the thermal imaging are in the exposed regions and non-coalesced polymeric particles remain the non-exposed regions. When the imaged element is contacted with the processing solution (described below), the core-shell particles in the processing solution complex with the coalesceable particles in the non-exposed regions. These complexes of particles in the non-exposed regions are removable after a few seconds dwelltime before the imaged element is used for printing.

Once the complexes of particles are removed, the non-exposed (or non-imaged) regions of the hydrophilic surface repel ink while the exposed (or imaged) regions containing coalesced particles remaining in the element accept ink.

When the imaged element is contacted with the processing solution, the hydrophilic polymer in the shell of the core-shell polymeric particles in the processing solution forms a non-covalent or non-ionic complex with the polymer in the outer surface of the coating particles in the non-exposed regions of the imageable layer. In some embodiments, the outer surface of the coating polymeric particles has a different composition than the shell of the core-shell polymeric particles in the processing solution. In other embodiments, if the coating particles are also core-shell particles, the shell composition may be the same or different as the shell composition of the particles in the processing solution. However, preferably, the shell compositions are different.

The core of the core-shell polymeric particles in the processing solution is generally composed of a hydrophobic thermoplastic polymer as described above for the coalesceable particles, and the shell of the particles is generally composed of a hydrophilic polymer that is covalently bonded to the core hydrophobic thermoplastic polymer. Representative core hydrophobic thermoplastic polymers include but are not limited to, one or more of polystyrenes (including polymers of styrene derivatives), poly(meth)acrylates, polymethylenelactone, poly(vinyl chloride), poly(meth)acrylonitriles, copolymers of styrenes and (meth)acrylonitriles, polyvinyl esters, polysulfone, polycarbonates, polyurethanes, and polyamides. Very useful hydrophobic polymers include polystyrenes, copolymers of styrenes and (meth)acrylonitriles, and (meth)acrylate(co)polymers.

The hydrophilic polymer the shell of the processing solution particles comprises recurring units that contain groups that will readily form the noted complex with the coalesced particles in the imaged element. Such useful "reactive" or "complexing" groups include but are not limited to, (meth)acrylamides, (meth)acrylphosphonates, (meth)acrylphosphates, (meth)acrylsulfates, vinyl imidazoles, polyethyleneoxide(meth)acrylates, polypropylene oxide(meth)acrylates, polyethylene-co-propylene oxide(meth)acrylates, [3-(methacryloylamino)propyl]dimethyl(3-sulfopropyl)ammonium hydroxide inner salt, [2-methacryloyloxy]ethyl [dimethyl-(3-sulfopropyl)ammonium hydroxide inner salt hydrate.

The hydrophilic polymers can have at least 10 and up to 100 mol % of recurring units containing such complexing groups, and typically they comprise from about 50 to 100 mol % of recurring units with such complexing groups, based on the total recurring units.

The core-shell polymeric particles used in the processing solution can be prepared by similar methods as the core-shell polymeric particles described above for the imageable layer. A useful synthetic method is described below for the Examples.

The useful core-shell polymeric particles in the processing solution generally have an average particle size of from about 25 to about 500 nm, or typically from about 30 to about 200 nm, as measured in the dry state by SEM.

The shell of the core-shell polymeric particles generally has an average thickness of from about 1 to about 50 nm (typically from about 1 to about 20 nm) and comprises from about 5 to about 50% (or typically from about 5 to about 25%) of the volume of the core-shell particles, on average, and the core has an average size of from about 20 to about 400 nm (or typically from about 20 to about 200 nm). These parameters are measurable using conventional apparatus, such as SEM. However, dynamic light scattering devices can also used if one takes into account that the shell of the particles can swell in an aqueous solution.

The core-shell polymeric particles are generally present in the processing solution in an amount of at least 1 and up to 75 weight %, and typically from about 2 to about 40 weight %, based on total processing solution weight.

The processing solution used in the practice of this invention has a pH of from about 7 to about 14 and typically from about 8 to about 12.

Optional addenda in the processing solution include but are not limited to, buffers, biocides, and other conventional additives for processing solutions.

Application of the processing solution can be carried out in conventional processing equipment such as Mercury Mark 6 processors (Eastman Kodak Company), which equipment may include rollers or brushes to facilitate the removal of complexes of polymeric particles in the non-exposed regions in the imaged element.

The imaged and developed element is generally not heated or baked in a postbake operation after the processing.

A lithographic ink and fountain solution can be applied to the printing surface of the imaged and processed element for printing. The exposed regions of the outermost imaged layer take up ink and the hydrophilic surface of the substrate revealed by the removal of the complexes of polymeric particles takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged element to the receiving material. The imaged elements can be cleaned between impressions, if desired, using conventional cleaning means and chemicals.

The present invention provides at least the following embodiments and combinations thereof:

1. A method of providing an image comprising:

A) thermally imaging a negative-working imageable element that comprises a hydrophilic substrate and has thereon a thermally-sensitive imageable layer comprising an infrared radiation absorbing compound and polymeric particles that coalesce upon thermal exposure, to provide an imaged element with exposed regions and non-exposed regions, the exposed regions comprising coalesced polymeric particles, and B) contacting the imaged element with a processing solution having a pH greater than 7 to about 14 to remove polymeric particles in the non-exposed regions, the processing solution comprising water-swellable core-shell polymeric particles that are different from the polymeric particles in the imageable layer.

2. The method of embodiment 1 further comprising rinsing and drying the imaged element prior to contacting it with the processing solution.

3. The method of embodiment 1 or 2 wherein the core of the core-shell polymeric particles is composed of a hydrophobic thermoplastic polymer, and the shell of the core-shell polymeric particles is composed of a hydrophilic polymer that is covalently bonded to the core hydrophobic thermoplastic polymer.

4. The method of embodiment 3 wherein the hydrophilic polymer comprises recurring units derived from (meth)acrylamides, (meth)acrylphosphonates, (meth)acrylphosphates, (meth)acrylsulfates, vinyl imidazoles, polyethyleneoxide (meth)acrylates, polypropylene oxide(meth)acrylates, polyethylene-co-propylene oxide(meth)acrylates, [3-(methacryloylamino)propyl]dimethyl(3-sulfopropyl)ammonium hydroxide inner salt, [2-methacryloyloxy]ethyl[dimethyl(3-sulfopropyl)ammonium hydroxide inner salt hydrate.

5. The method of any of embodiments 1 to 4 wherein the imageable layer comprises less than 10 weight % of free polymeric binder.

6. The method of any of embodiments 3 to 5 wherein the core hydrophobic thermoplastic polymer has a glass transition temperature greater than 40° C.

7. The method of embodiment 6 wherein the core hydrophobic thermoplastic polymer comprises at least one copolymer comprising repeating units derived from at least one monomer that is a styrene or styrene derivative, (meth)acrylate, methylenelactone, vinyl chloride, (meth)acrylonitrile, or vinyl ester, or a combination thereof.

8. The method of any of embodiments 1 to 7 wherein the core-shell polymeric particles have an average particle size of from about 25 to about 150 nm.

9. The method of any of embodiments 1 to 8 wherein the shell of the core-shell polymeric particles has an average thickness of from about 1 to about 10 nm and comprises from about 5 to about 25% of the volume of the core-shell particles, on average, and the core has an average diameter of from about 20 to about 120 nm.

10. The method of any of embodiments 1 to 9 wherein the coalesced polymeric particles are also core-shell polymeric particles.

11. The method of any of embodiments 1 to 10 wherein the outer surface of the coalesced polymeric particles has a different composition than the shell of the core-shell polymeric particles in the processing solution.

12. The method of any of embodiments 1 to 11 wherein during the contacting step, the hydrophilic polymer in the shell of the core-shell polymeric particles forms a non-covalent or non-ionic complex with the polymer in the outer surface of the non-coalesced particles in the non-exposed regions.

13. The method of any of embodiments 1 to 12 wherein the processing solution has a pH of from about 7 to about 12.

14. The method of any of embodiments 1 to 13 wherein the core-shell particles are present in the processing solution in an amount of at least 1 and up to 75 weight %, based on total processing solution weight.

15. The method of any of embodiments 1 to 14 wherein the infrared radiation absorbing compound is present in the single thermally-sensitive imageable layer in an amount of from about 1 to about 30%, based on the total imageable layer dry weight.

16. The method of any of embodiments 1 to 15 wherein the imaging is carried out using an infrared laser at a wavelength of from about 700 to about 1250 nm.

17. The method of any of embodiments 1 to 16 wherein the imageable element is a lithographic printing plate precursor that has an aluminum-containing substrate having a hydrophilic surface.

18. The method of any of embodiments 1 to 17 wherein the imageable layer consists essentially of the coalesceable polymeric particles and the infrared radiation absorbing compound.

19. The method of any of embodiments 1 to 18 wherein the infrared radiation absorbing compound is present only in the imageable layer.

The following examples are provided to illustrate the practice of the invention but are by no means intended to limit the invention in any manner.

EXAMPLES

A general processing solution was prepared for the examples using the following components and was adjusted to pH 10.5 using potassium hydroxide:

1.4 weight % of boric acid 10.0 weight % of core-shell polymeric particles 88.6 weight % of water.

Processing Solution 1 (Invention):

Core-shell polymeric particles were prepared with a polystyrene core and a shell comprising a polymer having sulfobetaine functional groups that was prepared using Monomer A shown below. The core to shell weight ratio was 80:20 and the particles had an average particle size of 40 nm (as measured in SEM). The dispersion of these core-shell polymeric particles was included in the general processing solution described above.

Monomer A

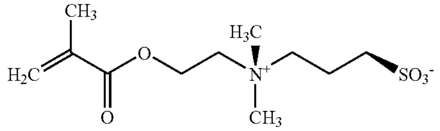

Processing Solution 2 (Invention):

Core-shell polymeric particles were prepared with a polystyrene core and a shell comprising poly(methacrylamide). The core to shell weight ratio 80:20 and the particles had an average particle size of 43 nm (as measured in SEM). The dispersion of these core-shell polymeric particles was included in the general processing solution described above.

Processing Solution 3 (Comparative):

A commercial gumming solution (WG100 available from Agfa) was used as a developer in place of the general processing solution described above.

Processing Solution 4 (Comparative):

The following developer was used in place of the general processing solution described above:

1.4 weight % of boric acid 2.5 weight % of acrylic acid 2.5 weight % of an alkylarylsulfonate surfactant 93.6 weight % of water.

Processing Solution 5 (Comparative):

Core-shell polymeric particles were prepared having a polystyrene core and a poly(acrylic acid) shell at a core to shell weight ratio of 80:20 and an average particle size of 38 nm (as measured using SEM). These core-shell particles were used in the general processing solution described above.

Processing Solution 6 (Comparative):

Core-shell polymeric particles were prepared having a polystyrene core and a poly(hydroxyethyl methacrylate) shell at a core to shell weight ratio of 80:20 and an average particle size of 44 nm (as measured using SEM). These core-shell particles were used in the general processing solution described above.

Samples of a single-layer imageable element were prepared by coating the following imageable layer formulation onto a grained and anodized aluminum substrate and dried for 5 minutes at 70° C.:

1.5 g of an IR dye having the following formula:

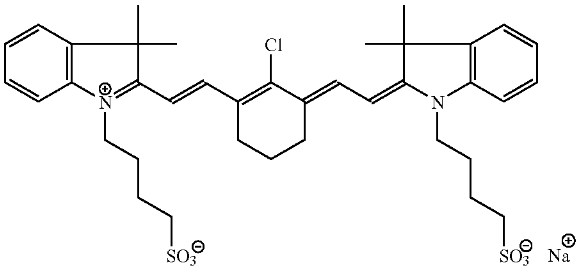

42.5 g of a core-shell polymeric dispersion prepared as described below, and 50 g of deionized water.

The core-shell polymeric particles used in the imageable layer were prepared using:

119.24 g of styrene (50 mol %), 60.76 g of acrylonitrile (50 mol %), 800 g of water, 20 g of ethylene glycol methacrylate phosphate, 12 g of sodium dodecyl sulfate (SDS), and 2 portions of 2.70 g of potassium peroxo disulfate (KPS).

The SDS was dissolved in the water and heated to 80° C. and one portion of KPS was then added and the styrene and acrylonitrile were added slowly under vigorous stirring. After two hours or reaction, the second portion of KPS was added and the ethylene glycol methacrylate phosphate was added slowly into the dispersion. After two hours of further reaction, the resulting dispersion was cooled down slowly to room temperature and used to prepare the imageable layer formulation.

The imageable element samples were imaged using either a Kodak® Magnus 400 or a Kodak® Quantum 800 imager. The imaged elements were then processed using the various processing solutions. The following TABLE I shows the results of the printing plates having been treated with the processing solutions described above for the various Invention and Comparative Examples before use for printing on the printing press. A printing plate is considered to have toning when after 50 sheets the non-exposed areas still carry some ink.

When using fresh processing solutions or developers, none of the printing plates exhibited toning. Using a processing solution fluid that was already loaded with imageable layer coating to an extent of about 12 g coating per liter, the results looked different. The printing plates using Processing Solutions 1 and 2 (Invention) were clear in the non-exposed regions (no toning) while the printing plates processed using Processing Solutions 3-6 (Comparatives) exhibited at least slight toning.

Additional samples of the imageable elements that had been contacted with "loaded" processing solution or developer were subjected to humid aging conditions as noted in TABLE I. This test simulates a waiting period in the pressroom over weekend after imaging before using the imaged elements. The results of this test showed good start-up properties when the present invention was carried out using Processing Solutions 1 and 2. However, the printing plates treated with Processing Solutions 3-6 (Comparatives) exhibited at least slight toning and worse toning when used for printing.

TABLE I

| Example (Processing Solution) | Toning on press (fresh processing solution) | Toning on press (loaded processing solution) | Humidity ageing* of plates treated with loaded processing solution |
|---|---|---|---|
| Invention Example 1 (1) | Good | Good | Good |
| Invention Example 2 (2) | Good | Good | Good |
| Comparative Example 1 (3) | Good | Slight tone | Toning |
| Comparative Example 2 (4) | Good | Slight tone | Toning |
| Comparative Example 3 (5) | Good | Slight tone | Slight tone |
| Comparative Example 4 (6) | Good | Slight tone | Slight tone |

*24 hours at 40° C. and 80% relative humidity

The invention has been described in detail with particular reference to certain preferred embodiments thereof, but it will be understood that variations and modifications can be effected within the spirit and scope of the invention.

The invention claimed is:

1. A method of providing an image comprising:

A) thermally imaging a negative-working imageable element that comprises a hydrophilic substrate and has thereon a thermally-sensitive imageable layer comprising an infrared radiation absorbing compound and polymeric particles that coalesce upon thermal exposure, to provide an imaged element with exposed regions and non-exposed regions, the exposed regions comprising coalesced polymeric particles, and B) contacting the imaged element with a processing solution having a pH greater than 7 to about 14 to remove polymeric particles in the non-exposed regions, the processing solution comprising water-swellable core-shell polymeric particles that are different from the polymeric particles in the imageable layer, wherein the core of the water-swellable core-shell polymeric particles is composed of a hydrophobic thermoplastic polymer, and the shell of the water-swellable core-shell polymeric particles is composed of a hydrophilic polymer that is covalently bonded to the core hydrophobic thermoplastic polymer.

2. The method of claim 1 further comprising rinsing and drying the imaged element prior to contacting it with the processing solution.

3. The method of claim 1 wherein the hydrophilic polymer comprises recurring units derived from (meth)acrylamides, (meth)acrylphosphonates, (meth)acrylphosphates, (meth) acrylsulfates, vinyl imidazoles, polyethyleneoxide (meth) acrylates, polypropylene oxide(meth)acrylates, polyethylene-co-propylene oxide(meth)acrylates, [3-(methacryloylamino)propyl]dimethyl(3-sulfopropyl) ammonium hydroxide inner salt, [2-methacryloyloxy]ethyl [dimethyl(3-sulfopropyl)ammonium hydroxide inner salt hydrate.

4. The method of claim 1 wherein the imageable layer comprises less than 10 weight % of free polymeric binder.

5. The method of claim 1 wherein the core hydrophobic thermoplastic polymer comprises at least one copolymer comprising repeating units derived from at least one styrene or styrene derivative, (meth)acrylate, methylenelactone, vinyl chloride, (meth)acrylonitriles, or vinyl ester, or a combination thereof.

6. The method of claim 1 wherein the water-swellable core-shell polymeric particles have an average particle size of from about 25 to about 150 nm.

7. The method of claim 1 wherein the shell of the water-swellable core-shell polymeric particles has an average thickness of from about 1 to about 10 nm and comprises from about 5 to about 25% of the volume of the water-swellable core-shell particles, on average, and the core has an average diameter of from about 20 to about 120 nm.

8. The method of claim 1 wherein the coalesced polymeric particles are also core-shell polymeric particles.

9. The method of claim 1 wherein the outer surface of the coalesced polymeric particles has a different composition than the shell of the water-swellable core-shell polymeric particles in the processing solution.

10. The method of claim 1 wherein the processing solution has a pH of from about 7 to about 12.

11. The method of claim 1 wherein the water-swellable core-shell particles are present in the processing solution in an amount of at least 1 and up to 75 weight %, based on total processing solution weight.

12. The method of claim 1 wherein the infrared radiation absorbing compound is present in the single thermally-sensitive imageable layer in an amount of from about 1 to about 30%, based on the total imageable layer dry weight.

13. The method of claim 1 wherein the imaging is carried out using an infrared laser at a wavelength of from about 700 to about 1250 nm.

14. The method of claim 1 wherein the imageable element is a lithographic printing plate precursor that has an aluminum-containing substrate having a hydrophilic surface.

15. The method of claim 1 wherein the imageable layer consists essentially of the coalesceable polymeric particles and the infrared radiation absorbing compound.

16. The method of claim 1 wherein the infrared radiation absorbing compound is present only in the imageable layer.

17. A method of providing an image comprising:

A) thermally imaging a negative-working imageable element that comprises a hydrophilic substrate and has thereon a thermally-sensitive imageable layer comprising an infrared radiation absorbing compound and polymeric particles that coalesce upon thermal exposure, to provide an imaged element with exposed regions and non-exposed regions, the exposed regions comprising coalesced polymeric particles, and B) contacting the imaged element with a processing solution having a pH greater than 7 to about 14 to remove polymeric particles in the non-exposed regions, the processing solution comprising water-swellable core-shell polymeric particles that are different from the polymeric particles in the imageable layer, where the core of the water-swellable core-shell polymeric particles is composed of a hydrophobic thermoplastic polymer, and wherein the core hydrophobic thermoplastic polymer has a glass transition temperature greater than 40° C.

18. A method of providing an image comprising:

A) thermally imaging a negative-working imageable element that comprises a hydrophilic substrate and has thereon a thermally-sensitive imageable layer comprising an infrared radiation absorbing compound and polymeric particles that coalesce upon thermal exposure, to provide an imaged element with exposed regions and non-exposed regions, the exposed regions comprising coalesced polymeric particles, and B) contacting the imaged element with a processing solution having a pH greater than 7 to about 14 to remove polymeric particles in the non-exposed regions, the processing solution comprising water-swellable core-shell polymeric particles that are different from the polymeric particles in the imageable layer, the shell of the water-swellable core-shell polymeric particles is composed of a hydrophilic polymer, and wherein during the contacting step, the hydrophilic polymer in the shell of the water-swellable core-shell polymeric particles forms a non-covalent or non-ionic complex with the polymer in the outer surface of non-coalesced particles in the non-exposed regions.

* * * * *